United States Patent [19]

Fujisawa et al.

[11] Patent Number: 4,476,495

[45] Date of Patent: Oct. 9, 1984

[54] MULTILEVEL SIGNAL COMPRESSION METHOD

[75] Inventors: Hiromichi Fujisawa; Hirohide Endo, both of Tokorozawa; Hitoshi Komatsu, Kanagawa, all of Japan

[73] Assignee: Hitachi, Ltd., Tokyo, Japan

[21] Appl. No.: 364,540

[22] Filed: Apr. 1, 1982

[30] Foreign Application Priority Data

Apr. 3, 1981 [JP] Japan .................................. 56-49314

[51] Int. Cl.$^3$ ............................................. H04M 1/00
[52] U.S. Cl. ..................................... 358/262; 358/261
[58] Field of Search ...................... 358/262, 261, 138; 375/17, 25; 371/86; 340/347 DD

[56] References Cited

U.S. PATENT DOCUMENTS

| | | | |
|---|---|---|---|
| 4,096,527 | 6/1978 | Furuta | 358/262 |
| 4,201,909 | 5/1980 | Dogliotti et al. | 358/262 |
| 4,399,467 | 8/1983 | Subramamiam | 358/262 |
| 4,420,771 | 12/1983 | Pirsch | 358/261 |

Primary Examiner—John C. Martin
Assistant Examiner—Edward L. Coles
Attorney, Agent, or Firm—Antonelli, Terry & Wands

[57] ABSTRACT

A digitized multilevel signal is encoded on the basis of unit combinations each including a run-length bit field indicative of run-length at each of the signal levels and a single continuation bit indicative of transition of the signal levels. The encoding is so modified that a virtual run of zero length is inserted when the transition of the signal levels at adjacent sampling points departs from a predetermined order. Polarity of the continuation bit is inverted upon every transition of the signal level.

2 Claims, 13 Drawing Figures

FIG. 1

| ℓ | B₂ CODE | B₁ CODE |
|---|---|---|
| | | $X = v$ |
| 1 | X 00 | X 0 |
| 2 | X 01 | X 1 |
| 3 | X 10 | X 0 X 0 |
| 4 | X 11 | X 0 X 1 |
| 5 | X 00 X 00 | X 1 X 0 |
| 6 | X 00 X 01 | X 1 X 1 |
| 7 | X 00 X 10 | X 0 X 0 X 0 |
| 8 | X 00 X 11 | X 0 X 0 X 1 |
| 9 | X 01 X 00 | X 0 X 1 X 0 |
| 10 | X 01 X 01 | X 0 X 1 X 1 |
| 11 | X 01 X 10 | X 1 X 0 X 0 |
| 12 | X 01 X 11 | X 1 X 0 X 1 |
| 13 | X 10 X 00 | X 1 X 1 X 0 |
| 14 | X 10 X 01 | X 1 X 1 X 1 |
| 15 | X 10 X 10 | X 0 X 0 X 0 X 0 |
| 16 | X 10 X 11 | X 0 X 0 X 0 X 1 |
| 17 | X 11 X 00 | X 0 X 0 X 1 X 0 |
| 18 | X 11 X 01 | X 0 X 0 X 1 X 1 |
| 19 | X 11 X 10 | X 0 X 1 X 0 X 0 |
| 20 | X 11 X 11 | X 0 X 1 X 0 X 1 |
| 21 | X 00 X 00 X 00 | X 0 X 1 X 1 X 0 |
| 22 | X 00 X 00 X 01 | X 0 X 1 X 1 X 1 |
| ⋮ | ⋮ | |

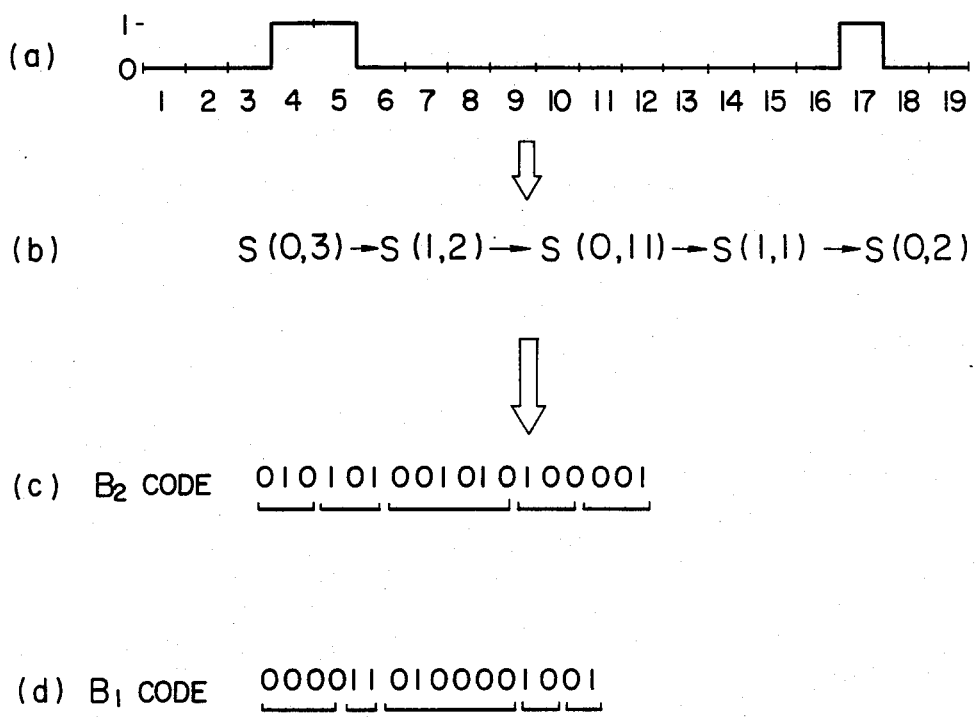
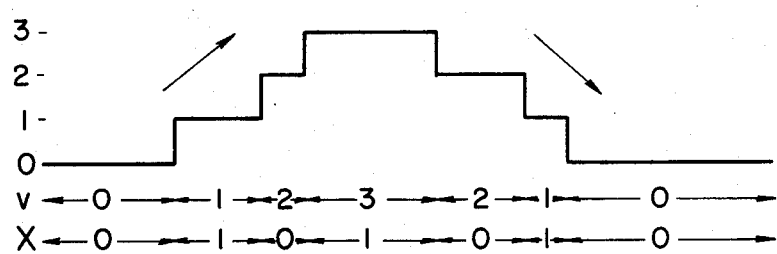

| ℓ | MB₂ CODE | MB₁ CODE |
|---|---|---|
| 0 | X 00 | X 0 |
| 1 | X 01 | X 1 |
| 2 | X 10 | X0 X0 |
| 3 | X 11 | X0 X1 |
| 4 | X00X00 | X1 X0 |
| 5 | X00X01 | X1 X1 |
| 6 | X00X10 | X0X0X0 |
| 7 | X00X11 | X0 X0 X1 |
| 8 | X01 X00 | X0 X1 X0 |
| 9 | X01X01 | X0X1X1 |
| 10 | X01 X 10 | X1X0X0 |
| 11 | X01 X11 | X1X0X1 |
| 12 | X10 X00 | X1X1 X0 |
| 13 | X10X01 | X1X1X1 |
| 14 | X10X10 | X0X0X0X0 |
| 15 | X10X11 | X0X0X0X1 |
| 16 | X11X00 | X0X0X1X0 |
| 17 | X11X01 | X0X0X1X1 |
| 18 | X11X10 | X0X1X0X0 |
| 19 | X11X11 | X0X1X0X1 |
| 20 | X00X00X00 | X0X1X1X0 |
| 21 | X00X00X01 | X0X1X1X1 |
| 22 | X00X00X10 | X1X0X0X0 |

| TIME | INPUT | | | | OUTPUT | | | | | |
|---|---|---|---|---|---|---|---|---|---|---|
| t | $X_{n-1}$ | $UD_{n-1}$ | $V_{n-1}$ | $V_n$ | UP | CTC | VRC | VDATA | $X_n$ | $UD_n$ |
| 1 | X | U | 1 | 0 | | Y | Y | 0 0 | $\bar{X}$ | D |
| 2 | X | U | 1 | 1 | Y | | | | X | U |
| 3 | X | U | 1 | 2 | Y | | | | $\bar{X}$ | U |
| 4 | X | U | 2 | 0 | | Y | Y | 0 | X | D |
| 5 | X | U | 2 | 1 | Y | | | | $\bar{X}$ | D |
| 6 | X | U | 2 | 2 | Y | | | | X | U |
| 7 | X | D | 0 | 0 | Y | | | | X | D |
| 8 | X | D | 0 | 1 | Y | | | | $\bar{X}$ | U |
| 9 | X | D | 0 | 2 | | Y | Y | 0 | X | U |
| 10 | X | D | 1 | 0 | Y | | | | $\bar{X}$ | D |
| 11 | X | D | 1 | 1 | Y | | | | X | D |
| 12 | X | D | 1 | 2 | | Y | Y | 0 0 | $\bar{X}$ | U |

MULTILEVEL SIGNAL COMPRESSION METHOD

BACKGROUND OF THE INVENTION

1. Field of the Invention

The present invention relates in general to a redundancy suppression of an image signal and in particular concerns a signal compression method which allows the redundancy suppression of a multilevel (gray scale) digital image signal to be effected with an enhanced compression efficiency.

2. Description of the Prior Art

Heretofore, the redundancy suppression of a binary signal has been adopted in the field of facsimile or FAX and the like technologies with a view to reducing a time required for transmission of information.

On the other hand, in an optical character reader (hereinafter referred to simply as OCR) or the like which is capable of reading document information at a high speed and thus requires an image signal buffer memory for storing once therein all the image information of a whole document for subsequent processings such as segmentation and recognition processings, the redundancy suppression of the image information signal is desired from the standpoint of decreasing the capacity of the buffer memory. In connection with the OCR systems, it is noted that scan is in general effected twice by changing the digitizing threshold level (i.e. so-called re-scan). Thus, in the case of the OCR in which all the image information of a whole document is once stored in the buffer memory as described above, whole signals having a plurality of levels corresponding to the number of the digitizing threshold levels as employed have to be stored simultaneously in the buffer memory. For this reason, the redundancy suppression of the multilevel signal is required.

In the OCR, the scan is usually effected up to twice, which means that the digital signals having three levels have to be handled. In the case of a four-level image signal, each of picture elements produces one of the four levels and thus provides two-bit information. In the case of this type OCR, there arises thus a demand for the technique which allows the four-level signal to be compressed.

A signal compression which is frequently adopted for the compression of the binary signal and referred to as B-code technique can be so expanded as to be applied to the multilevel signal, which however involves such a problem that the compression rate or efficiency is very low, as will be described hereinafter. As to the B-code, reference may be made to Suehiro and Matsumoto's "Facsimile Signal Band Compressing System" published by Nippon Hyoron-sha, Dec. 1977, pages 1101 and 1970 and Meyre's et al. "Optimum Run Length Codes" IEEE Trans.-COM-22, 6, p. 826 (1974).

SUMMARY OF THE INVENTION

An object of the present invention is to provide a redundancy suppressing method which is capable of compressing a multilevel signal with an increased compression efficiency by resorting to the use of a so-called MB-code (modified B-code), an improvement of the B-code taught by the invention.

In view of the above object, it is proposed according to a general aspect of the invention that a continuation bit field constituting a part of the B-code is implemented by a single bit, while the code is so modified that a virtual run of zero length is inserted at singular points at which the gray scale of the multilevel image signal undergoes transition of two steps (levels) or more and that the run of the zero length can be discriminated. Further, the number of the run-length bits is optimized for every level of the gray scale.

BRIEF DESCRIPTION OF THE DRAWINGS

FIG. 1 illustrates examples of $B_2$-code and $B_1$-code.

FIG. 2 illustrates a process of run-length redundancy suppression with the aid of the B-codes.

FIG. 3 illustrates exemplarily a correspondence relation between signal level transition and logic values of a continuation bit.

FIG. 6 illustrates examples of $MB_2$-code and $MB_1$-code according to the teaching of the present invention.

DESCRIPTION OF THE PREFERRED EMBODIMENTS

Figure 4:
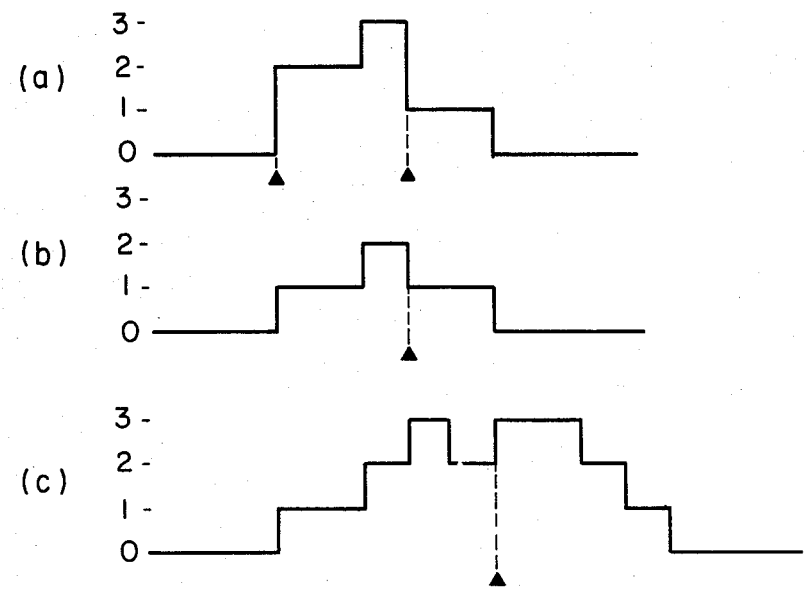
FIG. 4 illustrates examples of singular signal level transition.

Before entering into description of the principle of the MB-code taught by the present invention, elucidation will first be made of the known B-codes in some detail.

The redundancy suppression which is effected with the aid of the B-code and suited for the run-length encoding includes a state discriminating phase or process and an encoding process. It is now assumed that picture or image information is supplied on a line-by-line base with each line consisting of points (or picture elements) in number of L and that the suppression or compression is realized line by line. Signal value or level of a picture element located at an i-th point on a given scan line is represented by $v_i$ (where i is a given integer selected from a group of 1, 2, 3, . . . and L). Thus, when the image information to be handled is a binary signal, then the value $v_i$ is either "0" or "1".

On these conditions, there are available in the state discriminating process 2 L different states, i.e., a state corresponding to a single point having the signal level v of "0", a state corresponding to a succession of two points each having the signal level v of "0", a state corresponding to a succession of three points each having the signal level v of "0", . . . , a state in which L points each having the signal level v of "0" make appearance in succession; a state corresponding to a single point having the signal level v of "1", a state corresponding to a succession of two points each having the signal level v of "1", a state corresponding to a continuation of three points each having the signal level v of "1", ..., and a state in which L points each having the signal level v of "1" make appearance in succession. Let's express these states as follows:

$$S(v, l) \tag{1}$$

where v represents the signal value or level and l represents the length during which the points or picture elements having the same signal value or level make appearance in continuation. This length is referred to as the run-length.

In the succeeding encoding process, the states S(v, l) are encoded for transmission. The code resulted from this encoding process is the so-called B-code of the nature described below.

In order to realize successfully the redundancy suppression, the lengths of codes (i.e. bit length) representing the respective states should be as short as possible. Thus, the B-code is so prepared that the code of shorter length is assigned to the state which tends to make appearance at a greater probability.

In more particular, the B-code is composed of unit code words each of which is constituted by a set of a continuation bit field X including M bits and a run-length bit field Y including N bits. The number N of bits contained in the run-length bit field Y is selected to be optimum as a function of the run-length l, i.e. in consideration of probability distribution of the run-length l. In this connection, reference is to be made to the literatures cited hereinbefore. For this reason, the B-code is usually referred to also as the $B_N$-code, because the bit number N of the run-length bit field Y serves as a parameter in preparing the B-code.

FIG. 1 shows a table in which examples of $B_1$-code and $B_2$-code are listed. The continuation bit field X comprises the bits identifying the signal value v and is constituted by a single bit in the case of the binary image or picture signal. Accordingly, the unit code word XY includes two bits in the case of the $B_1$-code and three bits in the case of the $B_2$-code. Further, each of the codes representative of the states mentioned above includes, for example, three bits when $1 \leq l \leq 4$ and six bits when $5 \leq l \leq 20$ in the case of the $B_2$-code.

The boundary between two given adjacent states $S(v_j, l_j)$ and $S(v_{j+1}, l_{j+1})$ can be easily identified because the continuation bit X for the former state is $v_j$ while the continuation bit X for the latter is $v_{j+1}$, wherein $$v_j \neq v_{j+1} \tag{2}$$

In other words, it is a function of the continuation bit to permit the boundary between the adjacent codes to be identified.

Decoding of the B-code can also be effected on the basis of the principle briefed above.

FIG. 2 illustrates a process of run-length redundancy suppression effected with the aid of the B-code, wherein it is assumed that the binary or two-level image information or signal for a single line is such as illustrated at (a) in the same figure. On the assumption, the states identified in the state discriminating process are such as illustrated at (b). When codes are assigned to these states, respectively, by referring to the code table shown in FIG. 1, there are finally obtained a code string illustrated at (c) for the $B_2$-code and code string illustrated at (d) for the $B_1$-code. These code strings constitute, respectively, image information signals which have undergone the redundancy suppression. In the case of the illustrated example, it will be seen that the original image information containing 19 bits can be expressed by 18 bits in the case of $B_2$-code, while it can be expressed by 16 bits in the case of $B_1$-code.

In general, the $B_1$-code can assure a compression rate in a range of 10 to 20% for eight different image patterns for test recommended by Intenational Telegraph and Telephone Consultative Committee or CCITT.

Since the continuation bit field X of the B-codes mentioned hereinbefore contain gray scale image information the B-codes can be equally made use of for the redundancy suppression of multi-level image signals by using two bits for the continuation bit field X. However, it is impossible to attain an adequately high compression efficiency because of the adopted assumption that the gray scale values are statistically discrete or independent from one another at the individual points (picture elements).

In this connection, it is noted that in the case of common picture images such as character images to be processed by the optical character reader or OCR, for example, the gray scale values of the adjacent sample points exhibit a great mutual dependancy or correlation. Thus, by making use of this fact, it is possible to increase significantly the compression rate. The invention starts from the recognition of this fact.

Now, the principle of redundancy suppression according to the invention will be described in detail.

According to a first aspect of the invention, arrangement is made such that a single bit be sufficient for the continuation bit field X even for the multilevel image information.

By way of example, description will be made in conjunction with a four-level image signal by referring to FIG. 3. In most cases, the gray scale value v undergoes repeatedly level change or transition of such a pattern in which the gray scale value ascends stepwise from the level 0 (zero) to 3 and descends again to 0 (zero). In particular, such pattern of change in the gray scale value will occur very frequently in applications where re-scan operation of the OCR is presupposed. In this case, the continuation bit X takes repeatedly the levels 0 and 1 alternately and thus serves for the inherent function thereof.

However, there arise such cases where the value of v undergoes change or transition by two steps at a single point and/or returns to the level 0 without attaining the level 3. These points at which singular transitions occurs in the value of v will be referred to as the singular points. In FIG. 4, marks represent such singular points.

Thus, according to a second aspect of the present invention, it is taught how to deal with such singular transitions in the value of the signal level v. This problem is solved by introducing the concept of virtual run of the length zero. Such virtual run can be inserted in a number required in accordance with the number of the singular points, as is illustrated in FIG. 5, whereby the singular change pattern of the gray scale level v is virtually transformed into the standard gray scale change or transition illustrated in FIG. 3.

Figure 5:
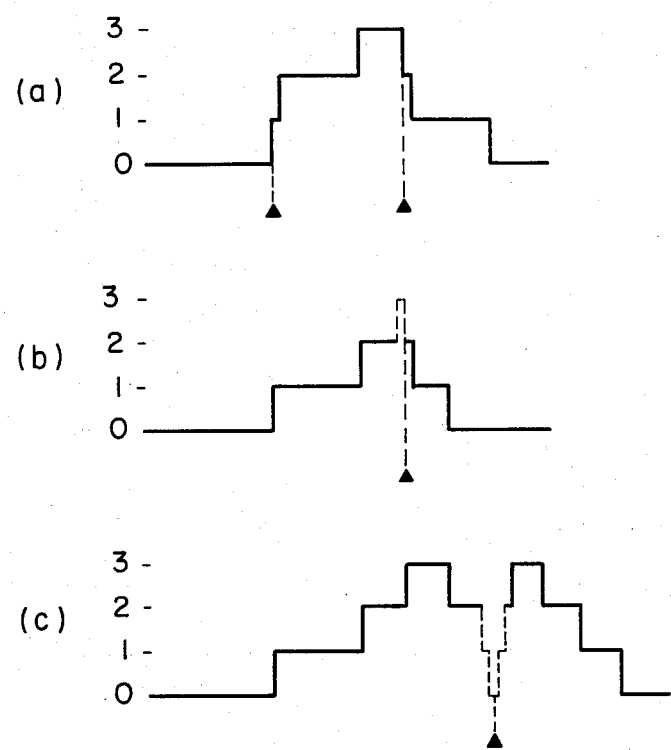
FIG. 5 illustrates examples of virtual run-length.

Graphs shown in FIG. 5 at (a), (b) and (c) correspond to those shown in FIG. 4 at (a), (b) and (c), respectively. In the case of the example illustrated at (a) in FIG. 5, the virtual runs S(1, 0) and S(2, 0) are inserted at respective singular points designated by the mark . In the case of the example illustrated at (b) in FIG. 5, virtual runs S(3, 0) is inserted, while virtual runs S(1, 0), S(0, 0) and S(1, 0) are inserted in the exemplary case illustrated at (c) in FIG. 5.

In this manner, all the changes or transitions which occur in the gray scale value can be reduced to the standard transition illustrated in FIG. 3, whereby the continuation bit can be implemented solely by repetition of the levels "0" and "1".

According to a third aspect of the present invention, it is contemplated to modify the code in connection with the introduction of the virtual run so that the run of the zero length can be expressed or identified. To this end, a code table which corresponds to the one shown in FIG. 1 is prepared according to the invention in a manner shown in FIG. 6. Characteristic feature of the code table prepared according to the invention can be seen in the fact that the code of the length l shown in FIG. 1 is taken as the code of the length $(l-1)$ in the code table shown in FIG. 6. This code series will be referred to as the $MS_N$ code.

Figure 7:
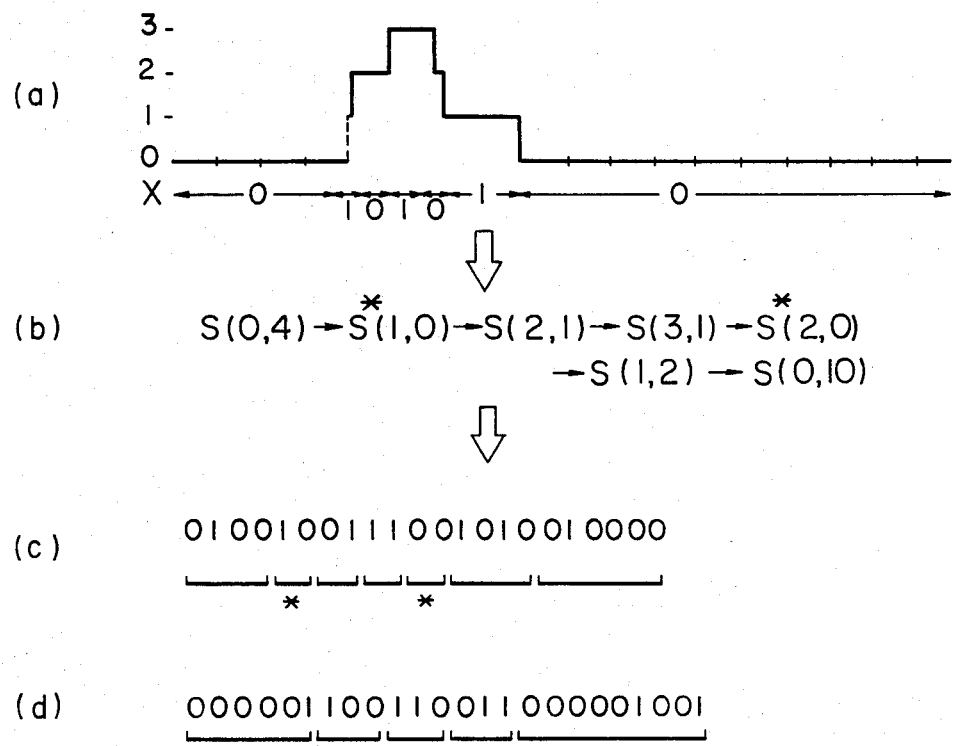
FIG. 7 illustrates comparatively a $B_1$-code and a $MB_1$-code.

FIG. 7 illustrates, by way of example, the redundancy suppression process of a multilevel image information signal taught by the invention. In this figure, a four-level image signal of a single line to be compressed is illustrated at (a). The result of the state discrimination process as effected on the four-level image signal (a) is shown at (b) in FIG. 7, wherein mark "*" indicates the introduced virtual runs. Encoding with the aid of the $MB_1$-code results in a compressed code shown at (c). It will be seen that the original non-compressed image signal which requires 36 bits can be expressed by 22 bits with the aid of the $MB_1$-code. By the way, the use of hitherto known $B_1$-code requires 2 bits for the continuation bits X and thus requires 24 bits in total, as illustrated at (d) in FIG. 7.

Figure 8:
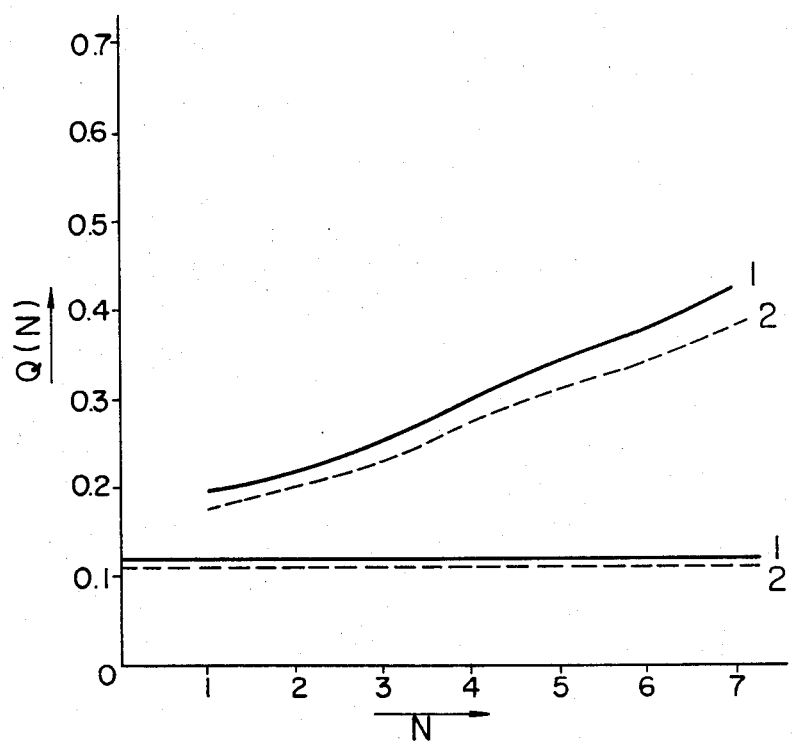
FIG. 8 graphically shows exemplary data of compression rate for a four-level image signal.

Optimal values of N of the $MB_N$-code have been experimentally determined for a four-level character image signal. In FIG. 8, there are graphically illustrated changes in the compression rate defined as the number of encoding bits required for a single picture element as a function of the number N of the run-length bits, wherein the compression rate Q is taken along the ordinate with the run-length bit number N being taken along the abscissa. A solid line curve 1 is obtained for the image signal which is compressed with a high compression rate while a broken line curve 2 is for the image signal exhibiting a poor compression rate. As can be seen from the results illustrated in FIG. 8, the code $MB_1$ (i.e. N=1) is most suitable for the character image signals to be processed in the OCR (optical character reader).

For example, the code $MB_1$ can assure the compression rate of 19.5% for the image signal represented by the curve 1. On the other hand, the optimal value of N obtained by using the $B_N$-code on the same experimental conditions is 2 (i.e. N=2). Similarly, the $B_2$-code assures the compression rate of 22.5% for the image signal 1. It has been found that the $MB_1$-code is excellent over the $B_2$-code for other image signals.

According to still another aspect of the present invention, it is proposed to optimize the run-length bit number N for every level of the gray scale v to thereby increase the compression rate as compared with the case where the number N of the $MB_N$-code remains constant thoroughly.

Figure 9:
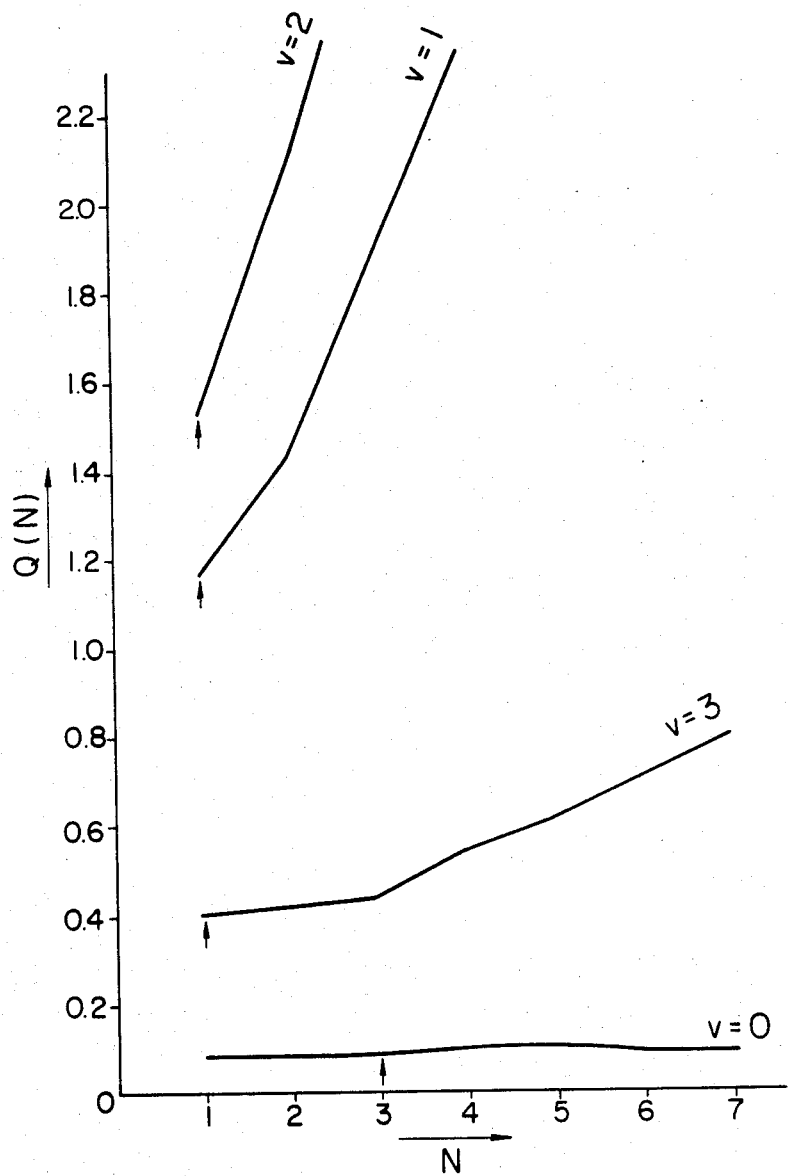
FIG. 9 graphically shows exemplary data of compression rates of a four-level image signal at every level as a function of value of N of $MB_N$-code.

FIG. 9 illustrates graphically the compression rate Q (N) as a function of N for the four-level image signal (i.e. v=0, 1, 2 and 3). The input image signal is same as the one represented by the curve 1 shown in FIG. 8. As indicated by arrows in FIG. 9, the optimal value of N for the level v of zero is 3, while the optimal value of N for the levels v of 1, 2 and 3 is 1 (one). This code series is referred to as $MB_{3111}$-code.

Figure 10:
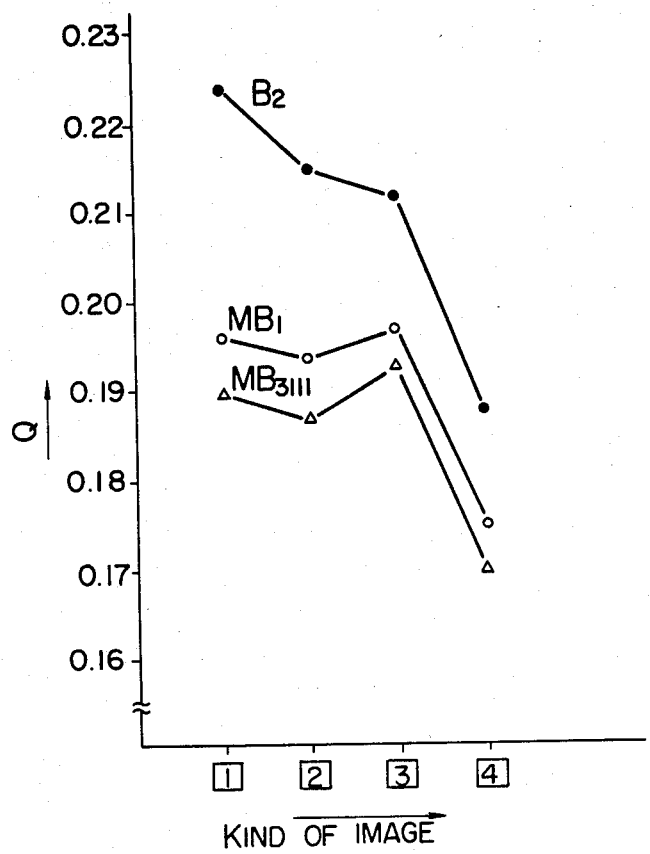
FIG. 10 graphically shows exemplary data of compression rates of four kinds image signal realized with a $B_2$-code, $MB_1$-code and $MB_{3111}$-code, respectively.

FIG. 10 graphically illustrates compression rates of four kinds of character image signals attained through use of the $B_2$-code, the $MB_1$-code and the $MB_{3111}$-code, respectively. In this figure, the four kinds of the image signals are indicated along the abscissa, while the compression rate Q is taken along the ordinate. It can be seen from this figure that the redundancy suppression based on the use of $MB_1$-code and the $MB_{3111}$-code according to the teaching of the invention is excellent over the hitherto known redundancy suppression which resorts to the use of the $B_2$-code.

In the foregoing, the principle of the redundancy suppression according to the teaching of the invention has been described in conjunction with the signal encoding. Since the signal decoding is effected in the manner reverse to the encoding and thus self-explanatory, further description is omitted.

Next, an exemplary circuit arrangement for carrying out the signal compression method according to the invention will be described. For simplification of description, a circuit configuration for realizing the signal compression by using the $MB_1$-code will be described in detail, while description of the circuit for signal compression with the aid of the $MB_{3111}$-code is omitted since the latter circuit can readily occur to those skilled in the art from the description of the former.

Figure 11:
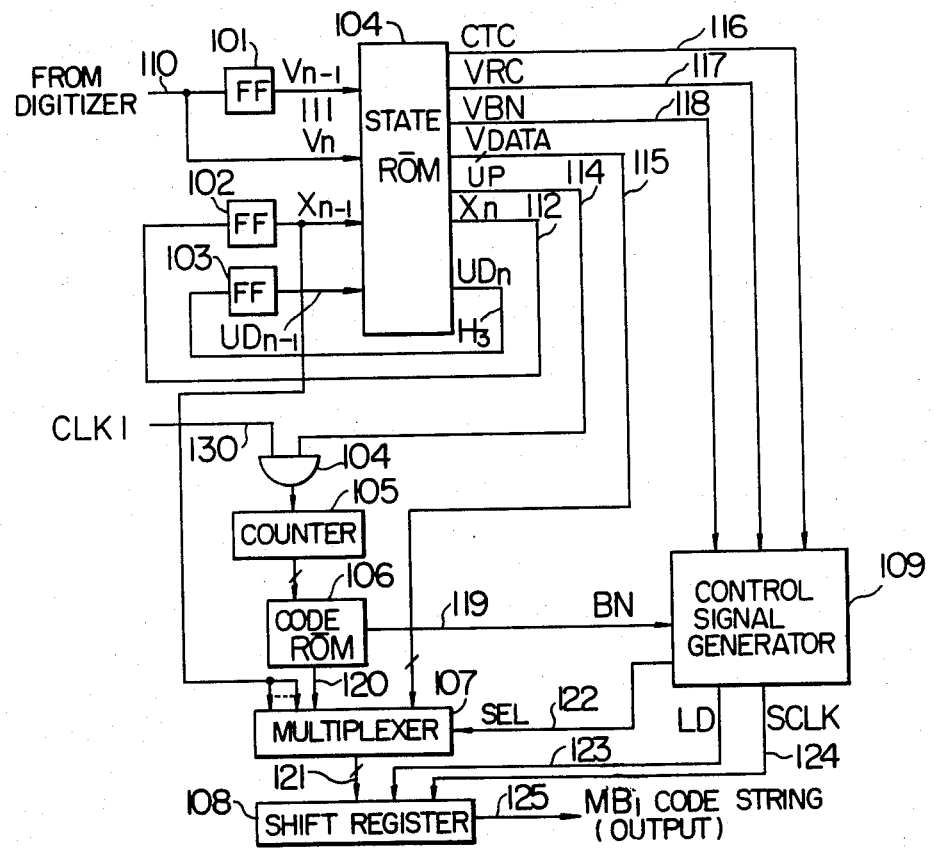
FIG. 11 shows in a circuit diagram an exemplary circuit arrangement for carrying out the signal compression method according to the invention.

FIG. 11 shows an arrangement of an encoding circuit for encoding image signals having three-level gray scale values (i.e. level 0, level 1 and level 2) with the aid of the $MB_1$-code. Referring to FIG. 11, an incoming digitized video signal 110 supplied from a digitizer (which has three reference or threshold levels) of an opto-electronic conversion circuit employed commonly in FAX, OCR and the like equipment is applied directly to a state ROM 104 as the signal $V_n$ and at the same time supplied to the ROM 104 as the signal $V_{n-1}$ through a flip-flop 101 with a delay which corresponds to a single clock period of a first clock signal 130 (labelled CLK 1) produced from a block signal generator circuit (not shown), to thereby constitute a part of an address of the state ROM 104. The suffix n means that the video signal $V_n$ corresponds to the information sampled at a given clock time point $t_n$. Another part of the address of the state ROM 104 is constituted by the continuation bit signal $X_{n-1}$ supplied to the state ROM 104 from a flip-flop 102 at a time point $t_{n-1}$. Additionally, a level transit direction indicating signal $UD_{n-1}$ indicative of whether the image or video signal ascends from the level 0 toward the level 2 or it descends from the level 2 toward the level 0 is supplied to the state ROM 104 from a flip-flop 10 at the same time point $t_{n-1}$. The input signals to the flip-flops 102 and 103 are bothoutputted from the state ROM 104 as the information sampled at the time point $t_n$.

In this manner, the signals $V_{n-1}$, $V_n$, $X_{n-1}$ and $UD_{n-1}$ provide the input signals for addressing the state ROM 104. Signals outputted from the state ROM 104 in response to these input signals include a continuation bit signal 112 ($X_n$) and a transit direction indicating signal 113 ($UD_n$) at the time point $t_n$ and additionally include as control informations a count-up signal 114 (UP) for a counter 105, a virtual run data signal 115 (VDATA), a counter output control signal 116 (CTC), a virtual run output control signal 117 (VRC) and a virtual run valid bit number designating signal 118 (VBN).

Figures 12, 13:
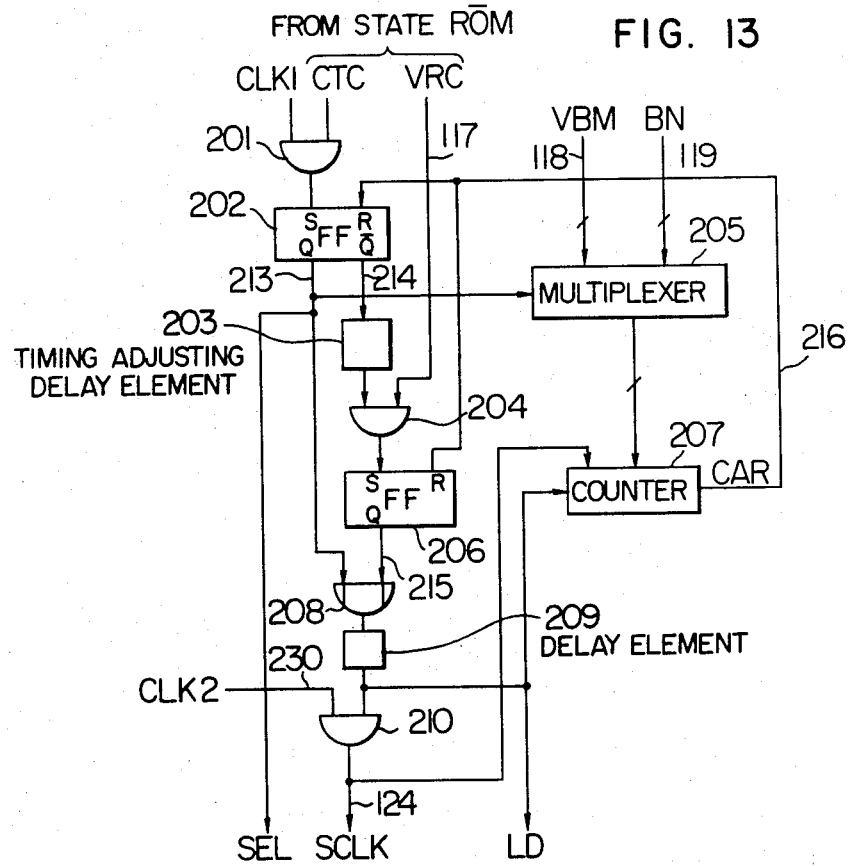
FIG. 12 shows an example of a table stored in a state ROM used in the system shown in FIG. 11.
FIG. 13 shows a circuit configuration of a control signal generator employed in the system shown in FIG. 11.

FIG. 12 shows several examples of the states of the input and the output signals to and from the state ROM 104 mentioned above. In this figure, symbol Y represents the output of logic "1", while blank space represents the output "DON'T CARE" (i.e. the output may be either logic "1" or "0"). Further, the virtual run data signal VDATA is of significance only when the virtual run output control signal VRC is logic "1" or "Y". In the following operations of the circuit shown in FIG. 11 will be described in conjunction with the normal level transition and the singular level transition.

(1) Normal Level Transition:

Referring to FIG. 12, the state at a time point $t_2$ in which $UD_{n-1}=U$, $V_{n-1}=1$ and $V_n=1$, for example, corresponds to the normal level transition. In this state, the count-up signal UP is outputted from the state ROM 104, resulting in that an AND gate 104A is opened, whereby the counter 105 is incremented in response to the clock signal CLK 1. Thus, the run-length of the signal $V_{n-1}$ represented by the contents of the counter 105 is updated.

As the consequence, the updated run-length of the signal $V_{n-1}$ is outputted from the counter 105 shown in FIG. 11 and inputted to a code ROM 106 as an addressing signal in response to which a $MB_1$-code 120 exclusive of the continuation bit is read out from the code ROM 106 and inputted to a multiplexer 107.

At that time, the counter output control signal CTC is supplied to a control signal generator 109 from the state 104, whereby a selection signal 122 (labelled SEL) and a load signal 123 (labelled LD) are generated through procedure described hereinafter and supplied to the multiplexer 107 and a shift register 108, respectively. This results in that the $MB_1$-code and the continuation bit $X_{n-1}$ held by the flip-flop 102 are inputted to the multiplexer 107 to be selected in response to the signal SEL and the corresponding output signal 121 is loaded from the multiplexer 107 to the shift register 108 in response to the load signal LD.

The contents of the shift register 107 is shifted by a predetermined number of bits in response to a shift clock signal 124 (labelled SCLK) produced by the control signal generator 109 in a manner described hereinafter and sequentially outputted as the $MB_1$-code string, each code including the code bits and the continuation bit in the united form.

(2) Singular Level Transition:

Referring to FIG. 12, the state prevailing at a time point $t_4$ in which $UD_{n-1}=U$, $V_{n-1}=2$ and $V_n=0$, for example, corresponds to the singular level transition. In the case of the normal level transition, the level should descend from the level 2 to the level 1 and hence to the level 0 (zero). However, since the singular transition is presupposed, the level 1 is skipped and a single virtual run-length is inserted at a portion which is to correspond to the level 1.

Under the circumstance, the run length of level 2 is converted into the $MB_1$-code string and outputted from the shift register 108 shown in FIG. 11 in the same manner as in the case of the normal level transition described above.

Subsequently, the signals VRC and VDATA are supplied from the state ROM 104 to the control signal generator 109 and the multiplexer 107, respectively, in order to effect the insertion of the virtual run-length. In this case, the signal VDATA is selected by the multiplexer 107 in response to the selection signal SEL supplied from the control signal generator 109, and the selected signal VDATA is loaded in the shift register 108 in response to the load signal LD.

The contents of the shift register 108 is shifted for a predetermined number of bits corresponding to the data length of the signal VDATA in response to the shift clock SCLK and outputted sequentially as the virtual run-length signal.

Subsequently, the run-length of the level 0 is sequentially outputted from the shift register 108 as the $MB_1$-code string in the same manner as in the case of the level 2 in the normal transition described hereinbefore.

By the way, the code ROM 106 stores therein the $MB_1$-code shown in FIG. 6 exclusive of the continuation bit at the address designated by the run-length (l) also shown in FIG. 6 and supplied from the output of the counter 105.

Next, a circuit arrangement as well as operation of the control signal generator 109 shown in FIG. 11 will be described in detail.

FIG. 13 shows an exemplary circuit configuration of the control signal generator 109.

In the run-length output phase in the normal level transition, an AND gate 201 is enabled in response to the counter output control signal or CTC to thereby cause a flip-flop 202 to be set by the clock signal CLK 1.

Then, Q-output signal 213 of the flip-flop 202 is supplied to the multiplexer 107 shown in FIG. 11 as the select signal SEL and at the same time applied to a multiplexer 205 shown in FIG. 13.

In the multiplexer 205, the run-length valid bit number indicating signal 119 (BN) supplied from the code ROM 106 shown in FIG. 11 is selected and supplied to a counter 207.

At that time, the Q-output signal 213 of the flip-flop 202 is supplied as the load signal LD to the shift register 108 shown in FIG. 11 through an OR gate 208 and a delay element 209 for adjusting the timing and simultaneously applied to the counter 207 as the load signal, whereby the signal BN mentioned above is loaded in the counter 207 in response to the front or leading edge of the load signal.

Further, a second clock signal 230 or CLK 2 produced by the aforementioned clock generator (not shown) is supplied to the shift register 108 shown in FIG. 11 as the shift clock signal SCLK through the AND gate 210 enabled by the load signal LD and at the same time supplied to the counter 207 as a count-down signal. When the contents of the counter 207 is counted down by the bit number designated by the signal BN, a carry signal 216 (labelled CAR) is produced by the counter 207, as the result of which the flip-flop 202 is reset by the carry signal CAR, to thereby terminate the run-length output phase in the normal level transition triggered by the counter output control signal 116 or CTC.

In the virtual run-length output phase in the singular level transition, the AND gate 204 shown in FIG. 13 is enabled by the signal VRC supplied from the state ROM 104 shown in FIG. 11, whereby the Q-output signal 214 of the flip-flop 202 produced upon termination of the immediately preceding run-length output phase is supplied to the reset input of flip-flop 206 through the timing adjusting delay element 203 and the AND date 204.

The Q-output signal 215 of the flip-flop 206 is supplied to the counter 207 as the load signal through the OR gate 208 and the timing adjusting delay element 209, whereby the virtual run valid bit number indicating signal 118 (VBN) selected by the multiplexer 205 in response to the select signal produced from the Q-output of the flip-flop 202 is loaded in the counter 207.

Subsequently, the clock signal CLK 2 is supplied to the counter 207 as the count-down signal through the AND gate 210. When the contents of the counter 207 are counted down by a number designated by the signal VBN, the carry signal CAR is produced to reset the flip-flop 206, whereupon the virtual run-length output phase in the singular transition initiated by the aforementioned signal VRC comes to an end.

In the foregoing description, it has been assumed for convenience sake that the three digitizing levels are used. However, it will be readily appreciated that the invention can equally be applied to a given number of the digitizing levels.

For the $MB_{3111}$-code, the circuit arrangement shown in FIG. 11 can be used as it is except that the contents stored in the state ROM 104 is altered correspondingly.

As will be appreciated from the foregoing, the present invention allows multilevel image information to be compressed at a significantly high rate, whereby the capacity of the video buffer memory can be remarkably decreased, to a great advantage.

We claim:

1. A multilevel signal compression method in which a digitized multilevel signal is encoded in respect of run-lengths, wherein a code which is composed of unit combinations each of run-length bits indicative of the run-length at each of the signal levels and a single continuation bit indicative of transition of said signal level is so prepared as to include a virtual run of zero length when the transition of the signal levels at adjacent sampling points departs from a predetermined order, and polarity of said continuation bit is inverted upon every occurrence of said transition of the signal level.

2. A multilevel signal compression method according to claim 1, wherein the number of said run-length bits contained in each of said unit combinations is set independently for each of said signal levels.

* * * * *